(12) United States Patent
Chu

(10) Patent No.: US 9,134,602 B2
(45) Date of Patent: Sep. 15, 2015

(54) METHOD OF MANUFACTURING AN EXTREME ULTRAVIOLET (EUV) MASK AND THE MASK MANUFACTURED THEREFROM

(71) Applicant: Taiwan Semiconductor Manufacturing Co., LTD., Hsinchu (TW)

(72) Inventor: Yuan-Chih Chu, New Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 156 days.

(21) Appl. No.: 13/952,846

(22) Filed: Jul. 29, 2013

(65) Prior Publication Data

US 2015/0030970 A1    Jan. 29, 2015

(51) Int. Cl.
*G03F 1/24*    (2012.01)
*G03F 1/72*    (2012.01)

(52) U.S. Cl.
CPC .................................. *G03F 1/24* (2013.01)

(58) Field of Classification Search
CPC ..................................... G03F 1/24; G03F 1/72
USPC .......................................................... 430/5, 394
See application file for complete search history.

(56) References Cited

U.S. PATENT DOCUMENTS

2006/0007433 A1*  1/2006  Ikuta et al. .................. 356/237.2
2010/0264037 A1* 10/2010  Cohen ............................ 205/131

* cited by examiner

*Primary Examiner* — Stephen Rosasco
(74) *Attorney, Agent, or Firm* — Maschoff Brennan

(57) ABSTRACT

Any defects in the reflective coating or absorber layer of an EUV mask are problematic in transferring a pattern of the EUV mask to a wafer since they produce errors in integrated circuit patterns on the wafer. In this regard, a method of manufacturing an EUV mask is provided according to various embodiments of the present disclosure. According to the method of the present disclosure, the defects in the EUV mask can be detected and repaired with an defect-free multilayer body. A substantially defect-free EUV mask can be made in a cost benefit way accordingly, so as to overcome disadvantages mentioned above.

20 Claims, 8 Drawing Sheets

METHOD OF MANUFACTURING AN EXTREME ULTRAVIOLET (EUV) MASK AND THE MASK MANUFACTURED THEREFROM

BACKGROUND

Semiconductor devices have been more and more miniaturized. The semiconductor devices are mass-produced by repeatedly applying a photolithography process to form different layers of material. In a photolithography process, a photomask having a pattern is irradiated with light to transfer the pattern onto a photosensitive coating on a semiconductor substrate (hereinafter, referred to as "wafer") via a reduction optical system. To improve photolithography resolution so smaller features can be patterned, the exposure wavelength of optical lithography have been shortened. In recent years, photolithography that uses extreme ultraviolet (EUV) light (wavelength=13.5 nm) having a much shorter wavelength has been in development. However, at short wavelengths for EUV lithography, the electromagnetic radiation is absorbed by most materials, including glass used for conventional lenses and masks. Therefore a completely different tool is necessary for performing EUV lithography compared to conventional photolithography.

Some EUV lithography tools employ reflection type photomasks. A reflective EUV lithography mask (hereinafter, referred to as EUV mask) is composed of a reflective multi-layer (ML) coating of alternatively stacked films of, for example, molybdenum (Mo) films and silicon (Si) films. The films are deposited on low thermal expansion material (LTEM) such as a quartz substrate or low-thermal-expansion glass substrate. An absorber pattern is formed on the reflective ML coating. The multilayer film is a dielectric mirror that reflects light through constructive interference.

Because of the extremely short exposure wavelength of 13.5 nm, a small perturbation in the surface of the dielectric mirror causes a phase defect in the reflection that can blur the pattern transferred onto a wafer. Some phase defects are caused by pits created during substrate polishing. Some phase defects are caused by particles on a substrate that cannot be removed by cleaning. Improvements in structures of and methods of forming EUV masks that reflect with little or no phase defects continue to be sought.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a gate stack includes embodiments having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Any defects in the reflective coating or absorber layer of an EUV mask are problematic in transferring a pattern of the EUV mask to a wafer since they produce errors in integrated circuit patterns on the wafer. In this regard, a method of manufacturing an EUV mask is provided according to various embodiments of the present disclosure. According to the method of the present disclosure, the defects in the EUV mask can be detected and repaired with an defect-free multilayer (ML) body. A substantially defect-free EUV mask can be made in a cost benefit way accordingly, so as to overcome disadvantages mentioned above.

Figure 1:
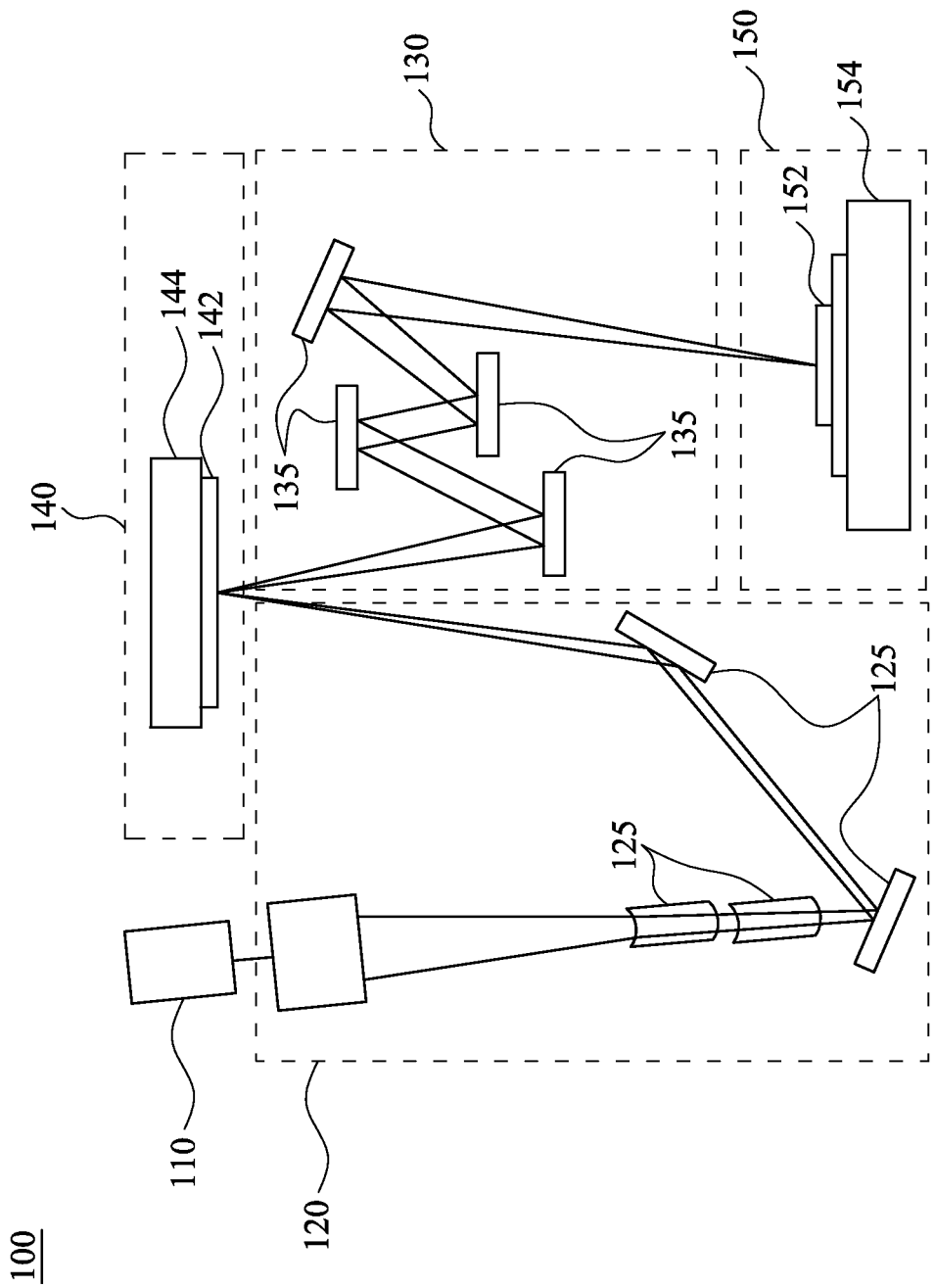
FIG. 1 is a block diagram of a photolithography imaging system that uses a mask in processing a wafer.

In FIG. 1, an EUV lithography imaging system 100 transfers a pattern of an EUV mask to a wafer. The system 100 includes a radiation source 110, a condenser optics section 120, a projection optics section 130, a mask stage 140, and a wafer stage 150. The radiation source 110 may be any source able to produce radiation in the EUV wavelength range. One example of a suitable radiation source 110 is a plasma created when a laser illuminates a gas, such as a supersonic jet of xenon gas. As another example, a suitable radiation source 110 may be formed using bending magnets and undulators associated with synchrotrons. As a further example, a suitable radiation source 110 may be formed or developed from discharge sources, which have the potential to provide adequate power in the desired wavelength range. EUV radiation is strongly absorbed in virtually all transmissive materials, including gases and glasses. To minimize unwanted absorption, EUV imaging is carried out in near vacuum.

The mask stage 140 includes a transport stage 144 that scans a mask 142. In the EUV lithography imaging system 100, the mask 142 is reflective because EUV radiation is strongly absorbed in most materials such as transmissive photomasks that are used in traditional photolithography imaging systems.

The projection optics section 130 reduces the image from the mask 140 in the mask stage 140 and forms the image onto wafer 152 in the wafer stage 150. In the EUV lithography imaging system 100, the projection optics are reflective because of the absorption associated with EUV radiation. Accordingly, the projection optics section 130 includes reflectors or mirrors 135 that project radiation reflected from the mask 140 onto the wafer. The reflectance spectrum of the mask 142 may be matched to that of the mirrors in the projection optics section 130. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used.

The wafer stage 150 includes a transport stage 156 that scans a semiconductor wafer 152 in synchrony with the mask 142 and steps the wafer 152 into a position to accept a next image from the mask 142. During operation, a semiconductor wafer 152 mounted to the transport stage 154. The projection optics impart the radiation light with a pattern in its cross-section to create a pattern in a target portion of the wafer 152. It should be noted that the pattern imparted to the radiation light may not exactly correspond to the desired pattern in the target portion of the wafer, for example if the pattern includes phase-shifting features or shadows. Generally, the pattern imparted to the radiation light will correspond to a particular functional layer in a device being created in a target portion of the wafer 152, such as an IC.

Figure 2:
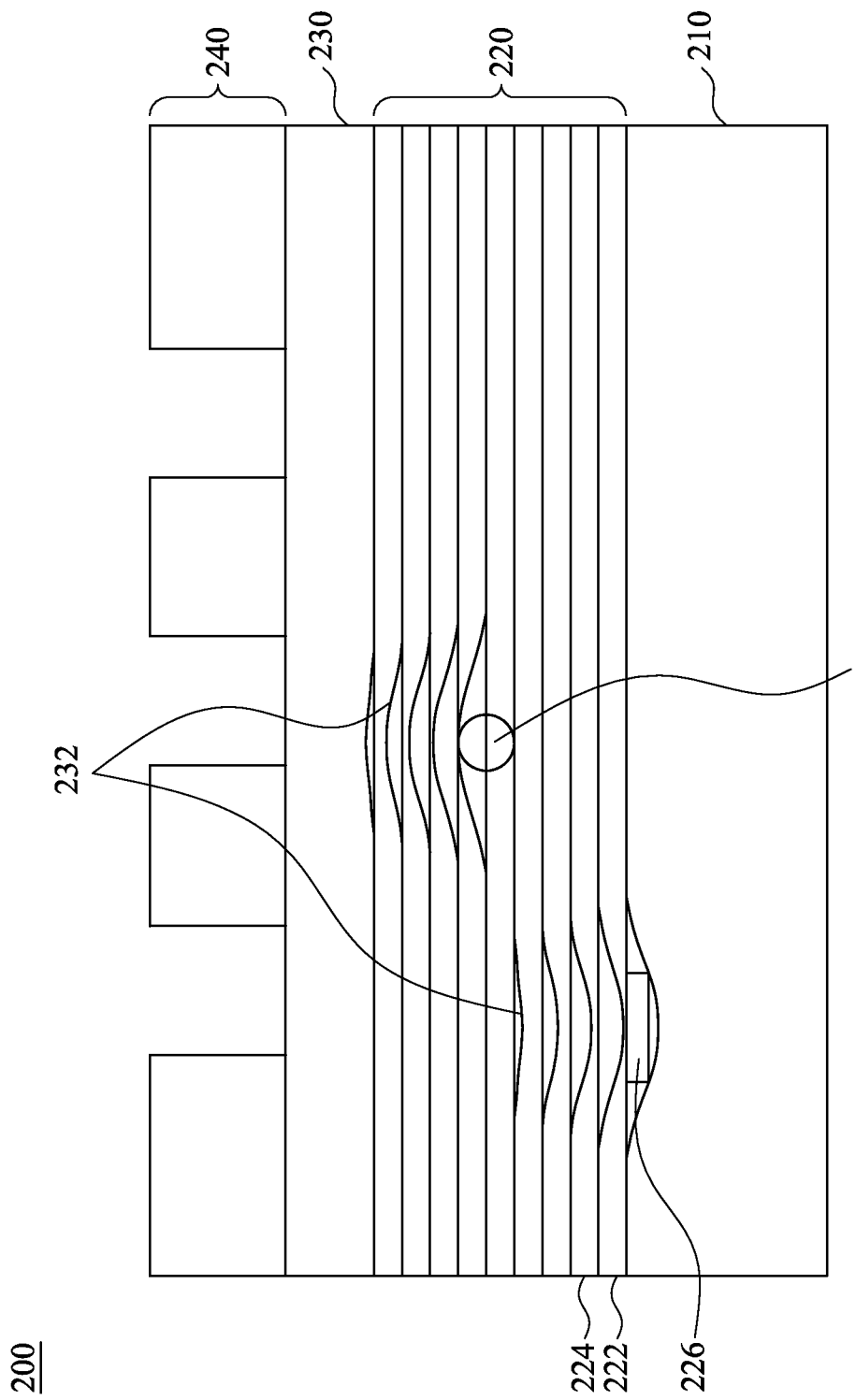
FIG. 2 is a schematic cross-sectional view of an EUV mask in the existence of defects.

FIG. 2 is a schematic cross-sectional view of an EUV mask 200 in the existence of defects. The EUV mask 200 includes a substrate 210, a reflective multiplayer (ML) film 220, a buffer or capping layer 230, and a patterned absorber layer 240. In general, the reflective ML film 220 consists of 40 pairs of molybdenum (Mo) layer 222 and amorphous silicon (Si) layer 224. The thickness of the individual layer of the reflective ML film 220 are about 3 and 4 nm for the Mo and Si, respectively. The reflectivity is a resonant property of the reflective Ml coating 220, such that the fields reflected by every pair of layers interfere constructively. The reflectivity occurs through the depth of the film, and any deformation or disruption of the layer structure within the reflective coating can become a defect. Two types of defects that commonly occur in a EUV mask are shown in FIG. 2. Defect 228 is formed in a reflective multiplayer (ML) film 220 and defect 226 occurs at a substrate 210, which exhibit in form 232 of a protruded shape (bump) and a recessed shape (pit), respectively. The form 232 of the defects denotes a protruded defect or a recessed defect. In the case of the protruded defect present, the surface of the reflective ML film 220 in FIG. 2 is partially bulged. The defects are considered to be an extrinsic defect that is a deformation or disruptions of the reflective ML film 220 and the substrate 210 nucleated by an external perturbation. The defects may be a particle imbedded in the reflective ML film 220 and the substrate 210 during the deposition process, or a particle, pit or scratch imbedded on the top of the coating after deposition. The effect of the defect on the reflected field will depend on where the defect is nucleated. When the nucleation occurs at the substrate 210, or in the bottom part of the reflective ML film 220, then the film growth dynamics will tend to damp out the structural perturbation. The other possibility is that the defect is nucleated near or at the top of the reflective ML film 220. This could be a particle introduced during the deposition of the top layers, or a particle, pit or scratch imbedded in the top surface subsequent to the deposition. The particle and the damaged part of the reflective ML coating will shadow the underlying layers and thereby attenuate the reflected field.

Defects that are categorized into an intrinsic type may occur in the EUV mask. The intrinsic defect is nucleated by the statistical fluctuations that are characteristic of the vapor deposition process that is used to deposit the reflective ML film 220. In particular, there is shot noise in the atom-by-atom deposition process that leads to the accumulation of random roughness. The variance of the roughness scales fairly linearly with the total thickness of the reflective ML film 220. The lower frequency components of the roughness are efficiently replicated by overlying layers and thereby propagate up towards the top of the coating. When one of these random thickness fluctuations exceeds a critical size that is approximately 0.5 m in height and 100 nm in width, it becomes an intrinsic defect. The resulting deformation of the layer structure produces an unacceptable perturbation in the phase of the reflected field. Both of the extrinsic- and intrinsic-type defects produce a modulation of the phase of the reflected field, and thus are phase defects.

Figure 3:
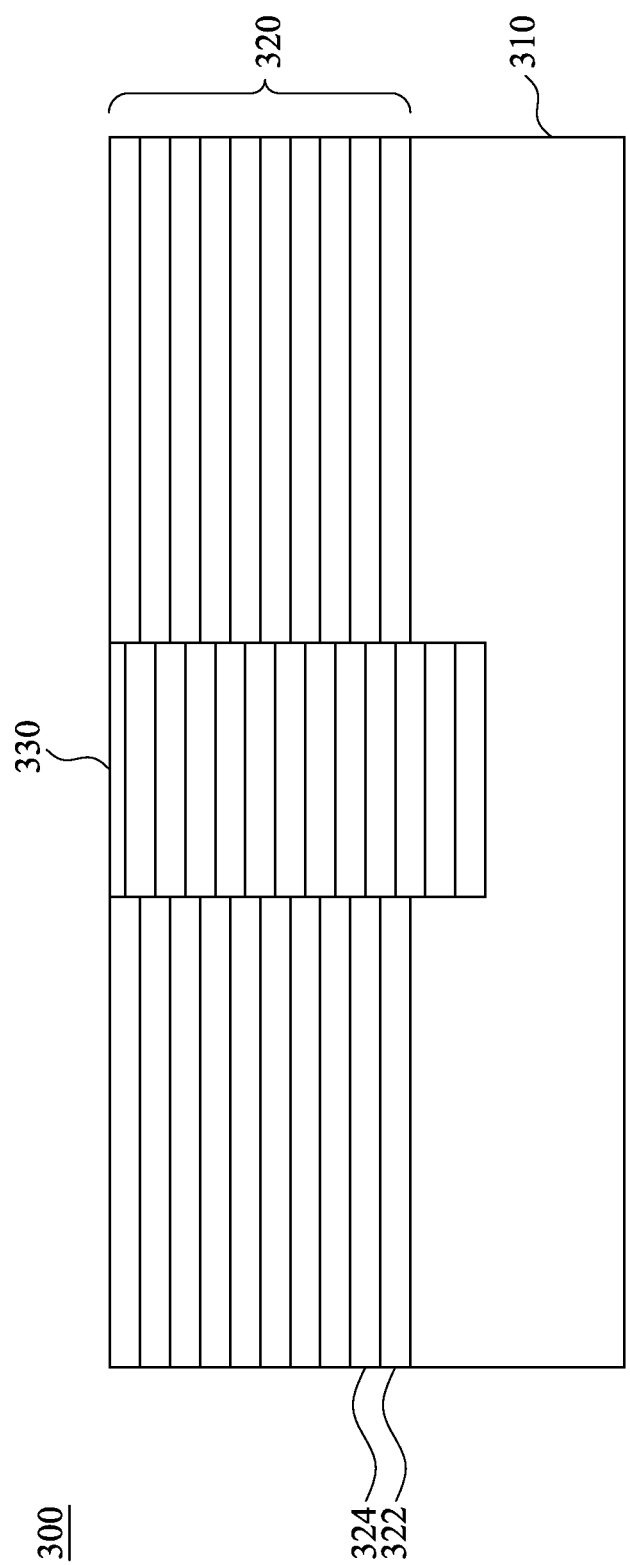
FIG. 3 is a schematic cross-sectional view of an EUV mask according to various embodiments of the present disclosure.

FIG. 3 is a schematic cross-sectional view of an EUV mask 300 according to various embodiments of the present disclosure. The EUV mask 300 includes a substrate 310, a first ML film 320 on the substrate 310, a second ML film 330 in the first ML film 320 and the substrate 310. The substrate 310 is required to satisfy properties as a substrate for an EUV mask blank. Accordingly, the substrate 310 may has a low thermal expansion coefficient (for example, the thermal expansion coefficient within a temperature range of from 19° C. to 27° C. is $0\pm1.0\times10^{-7}/°$ C. In various embodiments, the thermal expansion coefficient is $0\pm0.3\times10^{-7}/°$ C., $0\pm0.2\times10^{-7}/°$ C., $0\pm0.1\times10^{-7}/°$ C., or $0\pm0.05\times10^{-7}/°$ C. As the substrate 310, a glass having a low thermal expansion coefficient, such as a β quartz may be used, but the substrate is not limited thereto. The first ML film 320 of the EUV mask is particularly required with a high EUV light reflectance. The selection of materials in the first ML film 320 depends on the radiation wavelength (λ), in which each layer has a thickness of approximately one quarter of λ. In particular, the thickness of the respective layers of the first ML film 320 depends on the radiation wavelength λ, and the incidence angle of the radiation light. For EUV, the λ is 13.5 nm and the incidence angle is about 6 degrees. The maximum reflectance to light having a wavelength in the vicinity of 13.5 nm is at least 60%. The thicknesses of the alternating layers are tuned to maximize the constructive interference of the EUV light reflected at each interface and to minimize the overall absorption of the EUV light. The first ML film 320 can achieve about 60-75% reflectivity at the peak radiation wavelength. In various embodiments, the first ML film 320 has 30 pairs to about 60 pairs of alternating layers of a high index of refraction material 322 and a low index of refraction material 324. For example, 40 pairs of the alternative layers 322/324 of the first ML film 320 are deposited in which the high index of refraction material 322 may be formed from about 2.8 nm thick Molybdenum (Mo) while the low index of refraction material 324 may be formed from about 4.1 nm thick Silicon (Si).

The second ML film 330 has a columnar shape adjacent or with a gap to the first ML film 320 and the substrate 310. The second ML film 330 is a defect-free body and has same properties as that of the first ML film 320. In embodiments, the columnar shape of the second ML film 330 has a width (or diameter) of 0.1-10 um and a depth (or height) of 200-600 nm. As embodiments, the columnar shape has a top area equal or larger than a bottom area. According to various embodiments of the present disclosure, the EUV mask 300 may include an absorber layer, patterned or non-patterned over the top surface of the EUV mask 300.

As various embodiments, a buffer layer is between the absorber layer and the first ML film 320 and the second ML film 330. In various embodiments, the second ML film 330 has more reflective pairs than the pairs 322/324 of the first ML film 320, and extends into the substrate 310. The buffer layer acting as a capping layer, such as about 2.5 nm thick Ruthenium (Ru), may be formed at the top of the first ML film 320 to prevent oxidation of Molybdenum by exposure to the environment. The Ru capping layer is likely to be oxidized in a step to be carried out during production of a mask or in a step to be carried out at the time of producing a photomask from the mask (such as a cleaning, defect inspection, heating, dry etching or defect correcting step).

Figure 4:
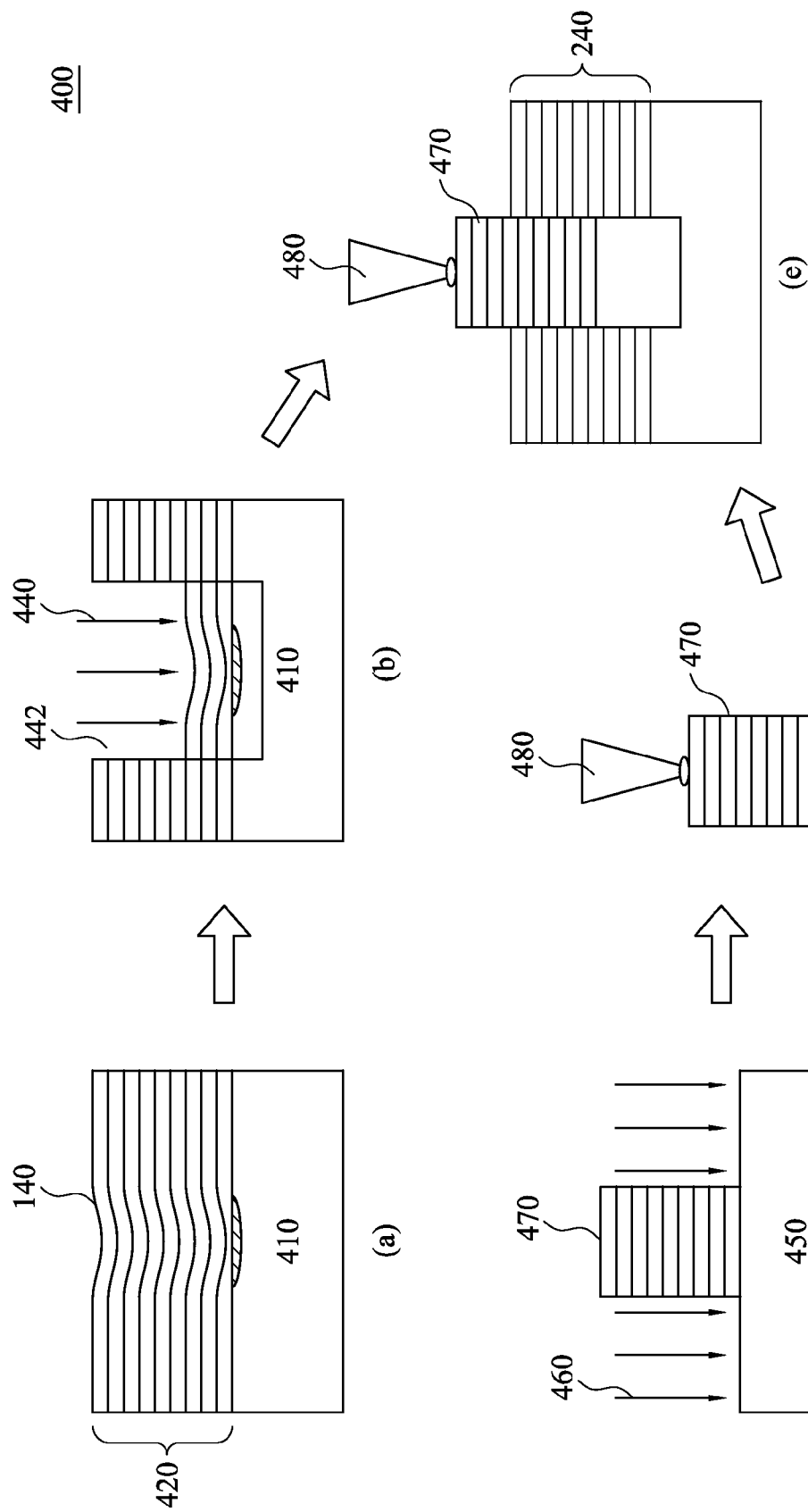
FIGS. 4(a)-(e) are schematic cross-sectional views at various stages of fabricating an EUV mask according to various embodiments of the present disclosure.

FIGS. 4(a)-(e) are schematic cross-sectional views at various stages of a method fabricating an EUV mask according to various embodiments of the present disclosure. The method is able to repair all types of aforementioned defects, so as to make a defect-free EUV mask according to various embodiments of the present disclosure. FIG. 4(a) is an EUV mask having a first ML film 420 formed on a substrate 410. A shift defect 432 results from a pit 430 located in the substrate 410. Referring to FIG. 4(b), a space 442 is introduced by eradicating a portion of the first ML film 420 by an ion beam or laser beam or an electron beam 440. Since defects such as the pit 430 may locate within the substrate 410, it is a routine operation according to various embodiments of the present disclosure that the space 442 extends into the substrate 410.

FIG. 4(c) is a diagram illustrating how a defect-free ML film (referred to as a "ML cake" hereinafter) is made. First, a sacrificial ML film deposited over a substrate 450 is provided. Ion beam or electron beam 460 is applied to remove a portion of the sacrificial ML film, so as to trim a ML cake 470 from the ML film, as shown in FIG. 4(c). Referring to FIG. 4(d), the ML cake 470 is fixed and lifted by a microprobe 480 from the substrate 450. As various embodiments of the present disclosure, the microprobe may be. In FIG. 4(e), the ML cake 470 is inserted as a plug into the space 442 of the first ML film 420. The insertion of the ML cake 470 may be assisted by, for example, a rigid tip equipped in a Atomic Force Microscopy. It is noted, as embodiments, that there are offset between individual layers of the ML cake 470 and the first ML film 420 and the substrate 410. The ML cake 470 has a columnar shape adjacent or with a gap to the first ML film 420 and the substrate 410. The ML cake 330 is a defect-free body and has same properties as that of the first ML film 420. In embodiments, the columnar shape of the ML cake 470 has a width (or diameter) of 0.1-10 um and a depth (or height) of 200-600 nm. As embodiments, the columnar shape has a top area equal or larger than a bottom area. According to various embodiments of the present disclosure, a protruded portion of the ML 470 cake from the top surface of the first ML film 420 may be leveled out by a suitable process.

Figure 5:
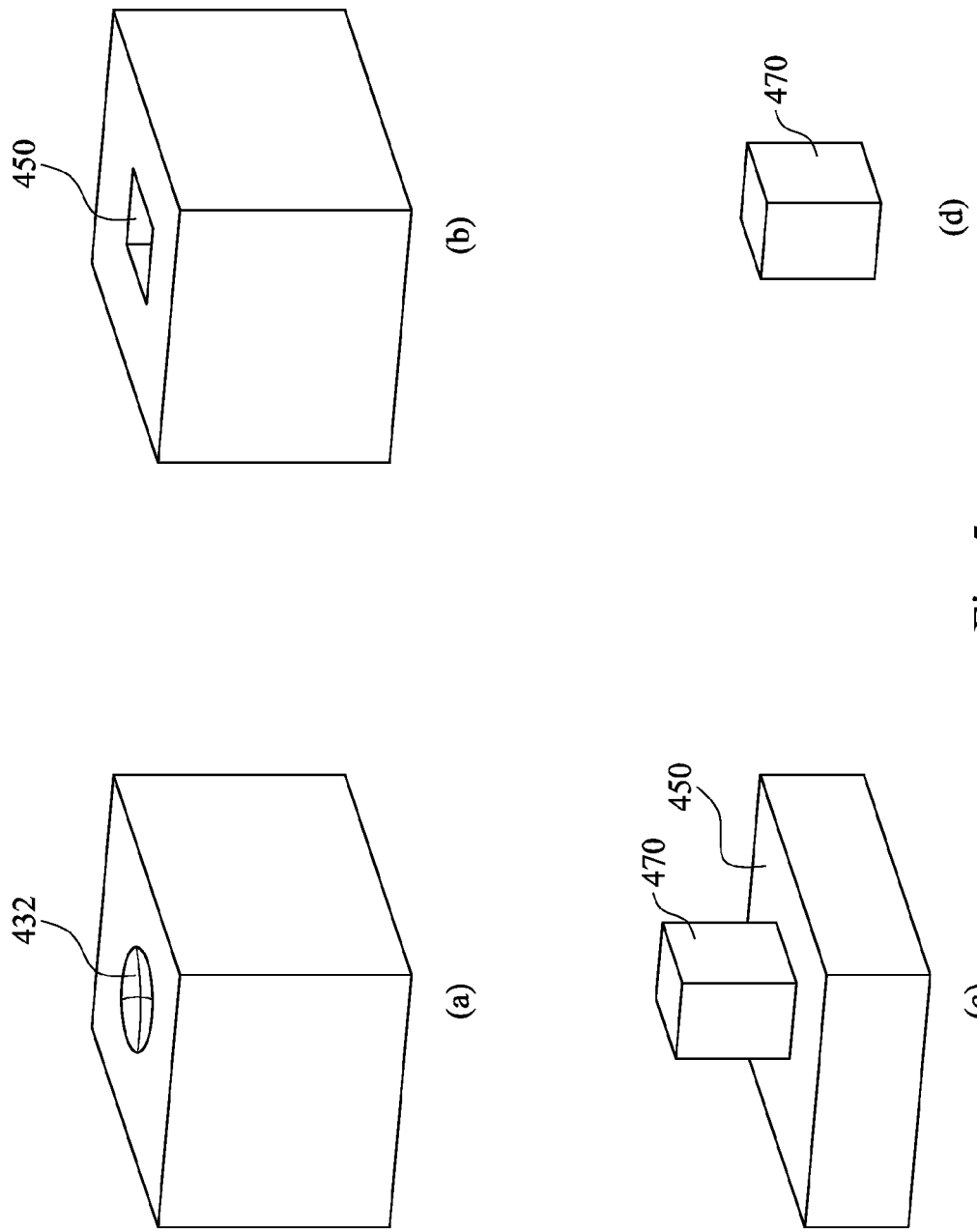
FIGS. 5(a)-(d) are prospective views schematically illustrating FIGS. 4(a)-(d) according to various embodiments of the present disclosure.

FIGS. 5(a)-(d) are prospective views schematically illustrating FIGS. 4(a)-(e) according to various embodiments of the present disclosure. FIG. 5(a) illustrates a recessed defect 432 on the top surface of the first ML film 420. In FIG. 5(b), a space having, for example, a rectangular cross-section is etched out by a suitable process, e.g., an ion beam. FIG. 5(c) illustrates how the ML cake 470 standing on the substrate 450 after processed by the ion beam 460. FIG. 5(d) is the ML cake 470 in a rectangular block, and may be any columnar shape matching with the shape of the space 442 according to various embodiments of the present disclosure. It is noted that the shape of the top and bottom area of the columnar ML cake 470 may be various, such as in a circular, polygonal or even irregular shape, as long as the ML cake able to be plugged into and substantially matched to the space 442 of the first ML film 420.

Figure 6:
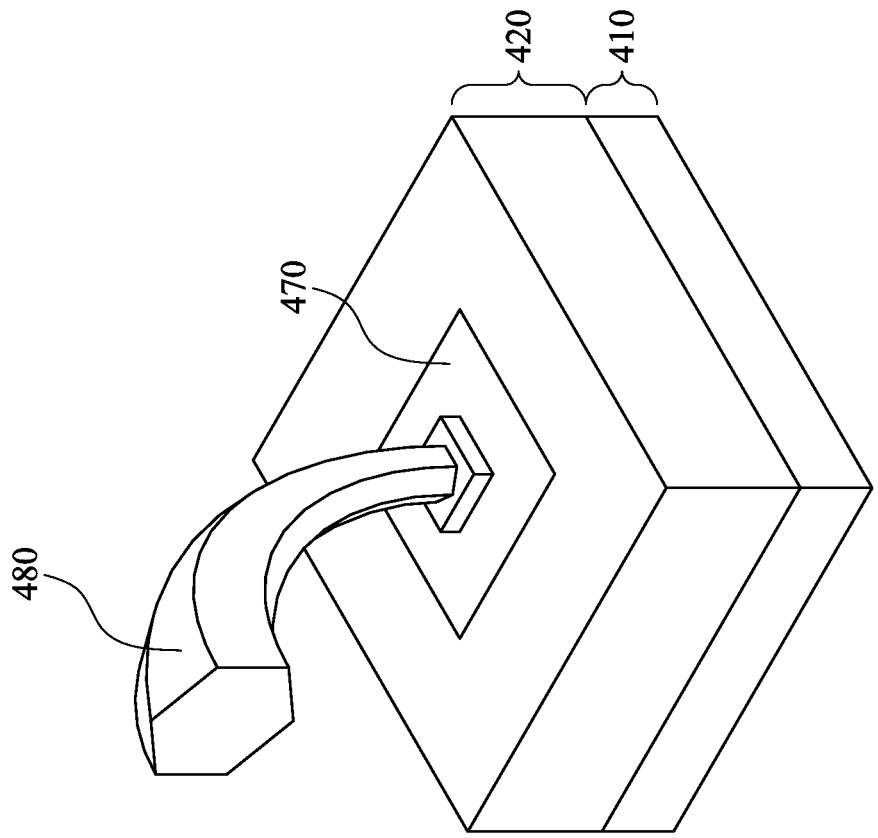
FIGS. 6 are 3-D views schematically illustrating a microprobe relocating a multiple body according to various embodiments of the present disclosure.
Figure 6:
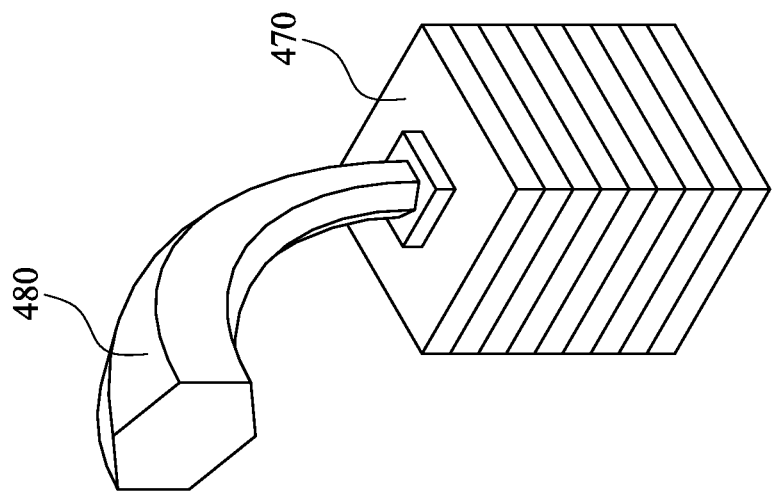

FIG. 6 are 3-D views schematically illustrating a microprobe relocating a multiple body according to various embodiments of the present disclosure. The left diagram shows the microprobe 480 fixedly attaches and elevates the ML cake 470. The ML 470 is lifted by the microprobe 480, positioned over an opening, and inserted into the opening (i.e. the space 442 in FIG. 5). Right diagram of FIG. 6 shows an operation that the ML cake 470 that has been plugged into the first ML film 420 and the substrate 410, with the attachment of the microprobe 480. Afterwards, the microprobe 480 is removed from the ML cake 470. In embodiments, the microprobe 480 may be an member used in preparing specimen for a Transmission Electron Microscopy (TEM), e.g., a Micro Probing system of SII® or Omniprobe Lift-Out system/EazyLift of FEI®. A gap may exist between the ML cake 470 and the first ML film 420 and the substrate 410. Analysis results indicate that the gap has a several nanometer tolerance, which substantially does not affect the reflective feature of the mask 400 repaired with the ML cake 470.

Figure 7:
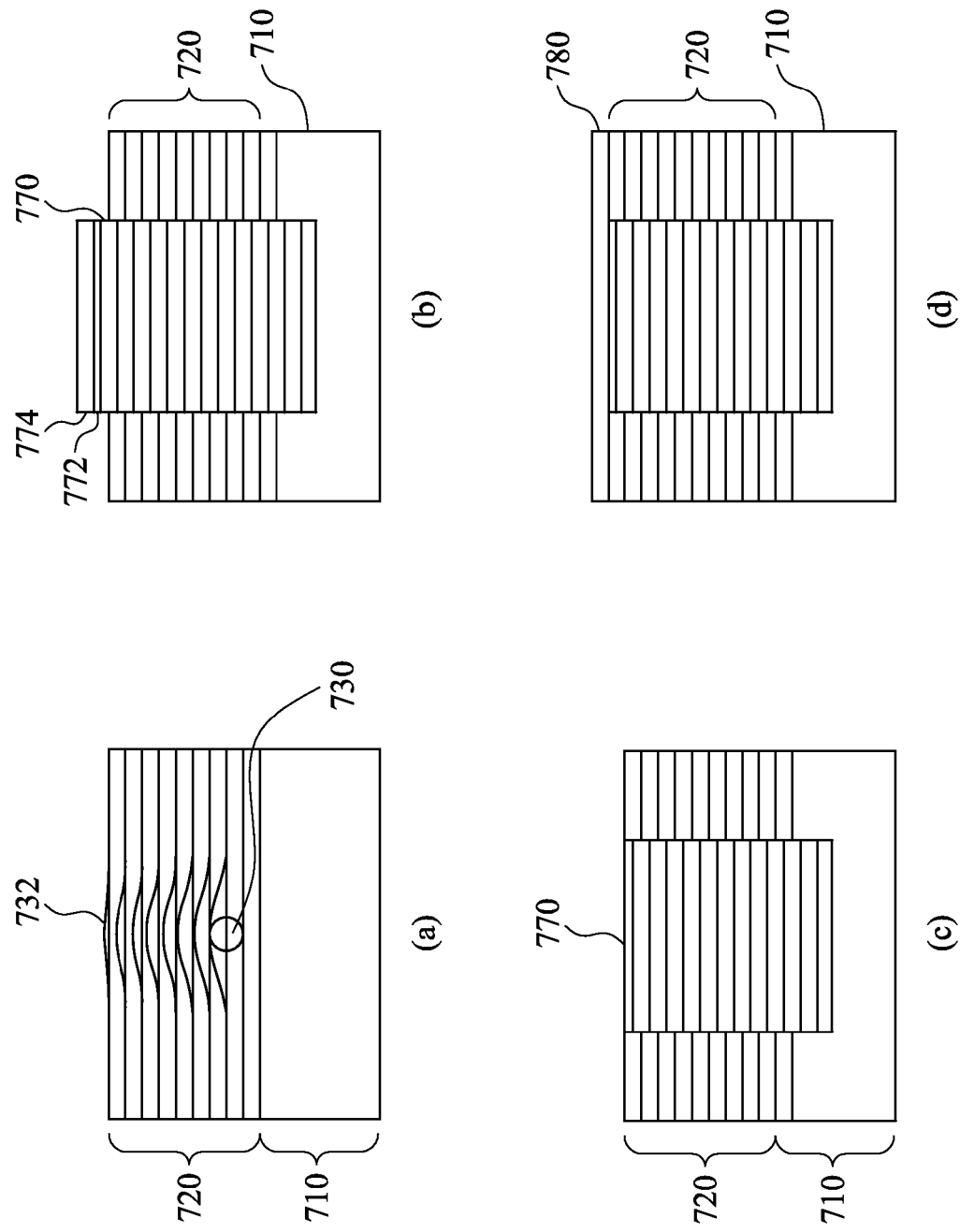
FIGS. 7(a)-(d) are schematic cross-sectional views at various stages of fabricating an EUV mask according to various embodiments of the present disclosure.

FIGS. 7(a)-(d) are schematic cross-sectional views at various stages of fabricating an EUV mask according to various embodiments of the present disclosure. FIG. 7(a) is an EUV mask includes a substrate 710, a first ML film 720. Defect form 732 occurs due to a particle 730 embedded in the first ML film 720, which exhibit in the defect form 732 of a protruded shape. In FIG. 7(b), a sacrificial ML film is in advanced coated thereover with a capping layer (e.g., Ru) 772 and an adhesive layer 774 (e.g., CrN) apt to be attached by a microprobe for relocating the ML cake 770. A ML cake 770 is trimmed from the sacrificial ML film with the capping layer 772 and the adhesive layer 774. Referring to Fig. (c), after the ML cake 770 is plugged in a space in the first ML film and the substrate 710, the capping layer 772 and adhesive layer 774 are polished away along with a portion of the ML cake 770. Further, in FIG. 7(d), an absorber layer 780 may be deposited over the top surface of the first ML film 720 and the ML cake 770. In embodiments, a capping layer (e.g., Ru) may first deposited over the surface of the first ML film 720 and the ML cake 770 before the deposition of the absorber layer 780.

Figure 8:
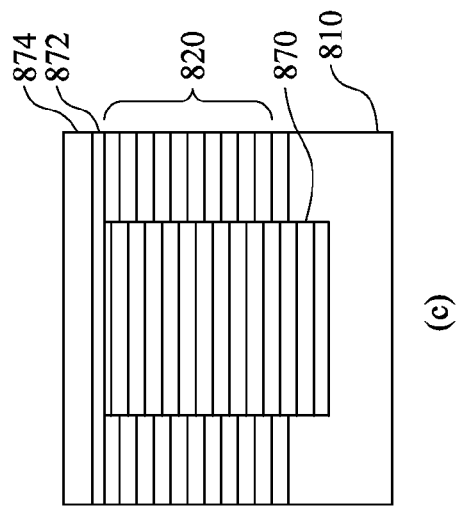
FIGS. 8(a)-(c) are schematic cross-sectional views at various stages of fabricating an EUV mask according to various embodiments of the present disclosure.
Figure 8:
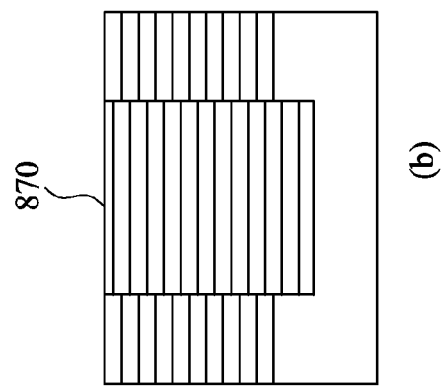
Figure 8:
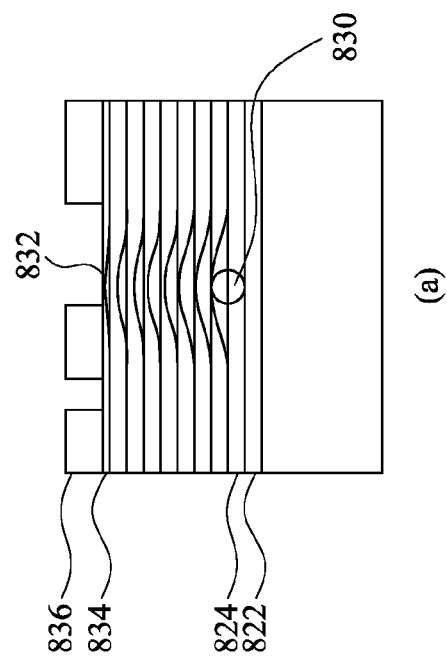

FIGS. 8(a)-(c) are schematic cross-sectional views at various stages of fabricating an EUV mask according to various embodiments of the present disclosure. FIG. 8(a) is an EUV mask includes a substrate 810, a first ML film 820, a capping layer 834 and an patterned absorber layer 836. Defect form 832 occurs due to a particle 830 embedded in the first ML film 820. The defect form 832 is found after the absorber layer 836 is patterned. To manufacture the EUV mask without defects according to various embodiments of the present disclosure, the patterned absorber layer 836 and the capping layer 834 are removed and a volume encompassing the defect form 832 is eradicated from the first ML film 830, leaving a space in the first ML film 830 and the substrate 810. Referring to FIG. 8(b), a defect-free ML cake 870 is trimmed from the sacrificial ML film and inserted into the space. Further, in FIG. 8(c), an capping layer 872 and an absorber layer 874 may again be deposited over the top surface of the first ML film 820 and the ML cake 870.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing an extreme ultraviolet (EUV) mask, the method comprising:
   providing a workpiece having a substrate with a multilayer (ML) film on the substrate;
   inspecting for defects on a top surface of the workpiece;
   if a defect is found, determining a first volume including the defect wherein the first volume has a first area in the substrate, a second area on a top surface of the first ML film and a peripheral surface between the first area and the second area;
   removing the first volume from the ML film and the substrate to form an opening;
   preparing a ML body that is defect free and matches the first volume in size and shape;
   plugging the ML body into the opening in the ML film and the substrate; and
   forming an absorber layer on the ML film and the ML body.

2. The method of manufacturing the EUV mask of claim 1, further comprising forming a buffer layer over the ML film.

3. The method of manufacturing the EUV mask of claim 1, wherein the ML body includes more reflective pairs than the ML film.

4. The method of manufacturing the EUV mask of claim 1, wherein preparing the ML body comprising comprises depositing a first capping layer over the ML body.

5. The method of manufacturing the EUV mask of claim 4, wherein preparing the ML body further comprises depositing a second capping layer over the first capping layer.

6. The method of manufacturing the EUV mask of claim 5, further comprising removing the second capping layer after plugging the ML body into the ML film and the substrate.

7. The method of manufacturing the EUV mask of claim 6, wherein removing the second capping layer is performed by polishing.

8. The method of manufacturing the EUV mask of claim 1, further comprising patterning the absorber layer.

9. The method of manufacturing the EUV mask of claim 8, further comprising:
   inspecting for defects on the absorber layer;
   if the defect is found after patterning the absorber layer, removing a second volume to form a second opening;
   preparing a second ML body;
   plugging the second ML body into the second opening in the ML film and the substrate;
   depositing another absorber layer over the ML film and a second capping layer over the another absorber layer;
   removing the second capping layer; and
   re-patterning the absorber layer and the another absorber layer.

10. The method of manufacturing the EUV mask of claim 1, wherein the first area is equal to or larger than the second area.

11. The method of manufacturing the EUV mask of claim 1, wherein the first area and the second area are independently in a circular, polygonal or irregular shape.

12. The method of manufacturing the EUV mask of claim 1, wherein plugging the ML body into the ML film and the substrate is conducted by a microprobing system or an omniprobe lift-out system.

13. The method of manufacturing the EUV mask of claim 1, wherein the ML body has a width of 0.1-10 um and a depth of 200-600 nm.

14. A method of relocating a multilayer body, comprising:
   preparing a multilayer (ML) film;
   trimming a ML body from the ML film;
   fixing a microprobe on a surface of the ML body;
   lifting off the ML body with the microprobe;
   positioning the ML body over an opening;
   inserting the ML body into an opening; and
   removing the microprobe from the ML body.

15. The method of relocating the ML body of claim 12, wherein the ML body has a width of 0.1-10 um and a depth of 200-600 nm.

16. The method of relocating the ML body of claim 14, wherein trimming the ML body from the ML film is performed by ion beam or electron beam.

17. The method of relocating the ML body of claim 14, wherein inserting the ML body into an opening is assisted by an atomic force microscopy.

18. The method of relocating the ML body of claim 14, wherein the ML body has a top area equal to or larger than a bottom area.

19. The method of relocating the ML body of claim 18, wherein the top area and the bottom area are independently in a circular, polygonal or irregular shape.

20. The method of relocating the ML body of claim 14, wherein the microprobe is a microprobing system or an omniprobe lift-out system.

* * * * *